United States Patent

Bates

[11] Patent Number: 5,885,541
[45] Date of Patent: Mar. 23, 1999

[54] TECHNIQUE FOR THE FABRICATION OF BULK POROUS DIAMOND

[76] Inventor: Stephen Cuyler Bates, P.O. Box 1310, Glastonbury, Conn. 06033

[21] Appl. No.: 888,970

[22] Filed: Jul. 7, 1997

[51] Int. Cl.[6] .................................................. C01B 31/06
[52] U.S. Cl. .......................... 423/446; 427/249; 427/596
[58] Field of Search ................................. 427/596, 595, 427/249; 423/446; 117/929

[56] References Cited

U.S. PATENT DOCUMENTS

| | | | |
|---|---|---|---|
| 5,209,916 | 5/1993 | Gruen | 423/446 |
| 5,328,676 | 7/1994 | Gruen | 423/446 |
| 5,360,477 | 11/1994 | Inoue et al. | 117/4 |
| 5,370,855 | 12/1994 | Gruen | 423/446 |
| 5,462,776 | 10/1995 | Gruen | 427/577 |
| 5,614,258 | 3/1997 | Moskovits et al. | 427/249 |
| 5,620,512 | 4/1997 | Gruen | 117/108 |

Primary Examiner—Roy V. King

[57] ABSTRACT

A method and system for fabricating porous polycrystalline diamond material whose volume is described by a dimension larger than 1 mm, with no upper limit on size. A net shape diamond part is fabricated by compacting small diamond particles into a mold and then performing chemical vapor deposition (CVD) growth of diamond on the particles until they are joined into a porous whole. The CVD growth of diamond is achieved by photofragmentation of vapor phase Fullerene, $C_{60}$, molecules in the pores. $C_{60}$ molecules are vaporized from solid $C_{60}$ at a temperature of about 800° C. The vapor diffuses into the voids between the diamond particles in the mold. The vapor is then subjected to intense illumination by a laser which causes the $C_{60}$ molecules fragment. The deposition of these fragments causes diamond growth to occur on all surfaces around the pores between the particles. Continual replenishment of the $C_{60}$ by the vapor source allows continuous deposition. The transparency of the diamond particles allows penetration of the laser illumination into the volume of the particles. After sufficient deposition and growth, diamond connections are made between the particles, making the entire mass a porous, single diamond entity.

7 Claims, 2 Drawing Sheets

Schematic of a bulk porous diamond fabrication apparatus.

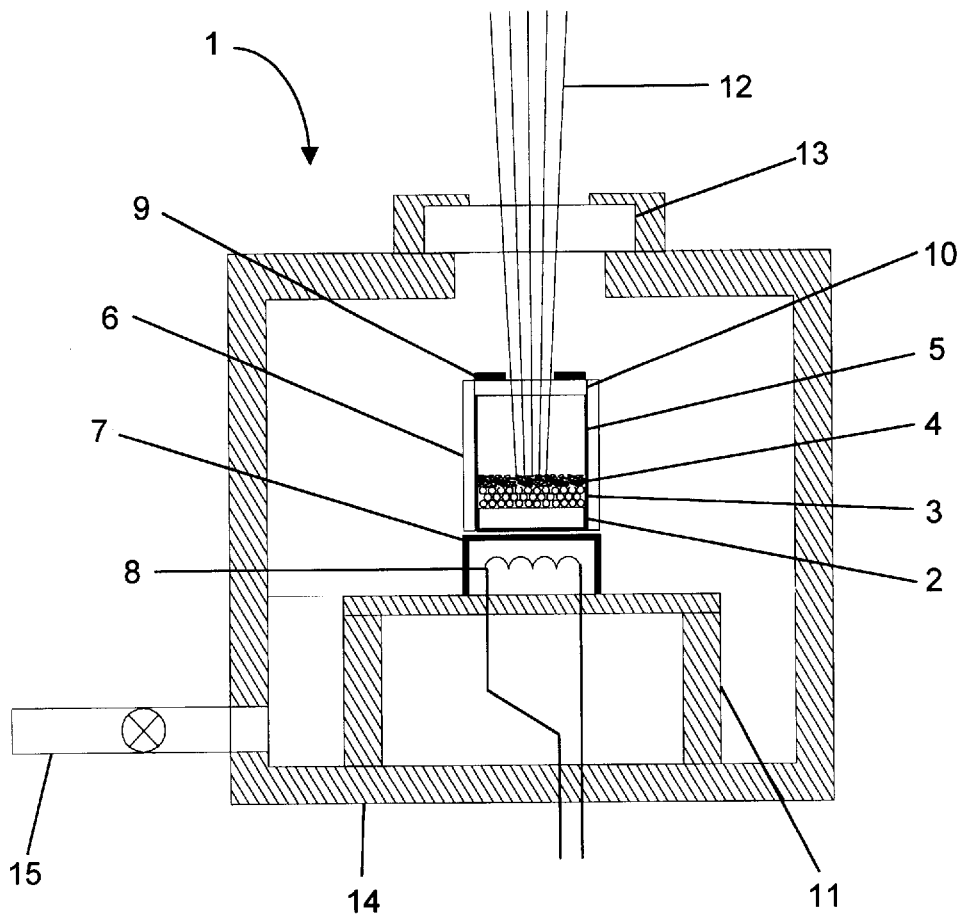
Figure 1. Schematic of a bulk porous diamond fabrication apparatus.

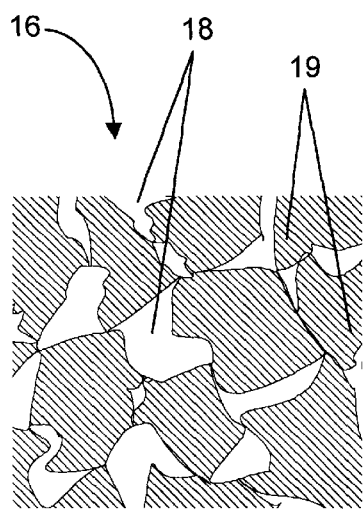 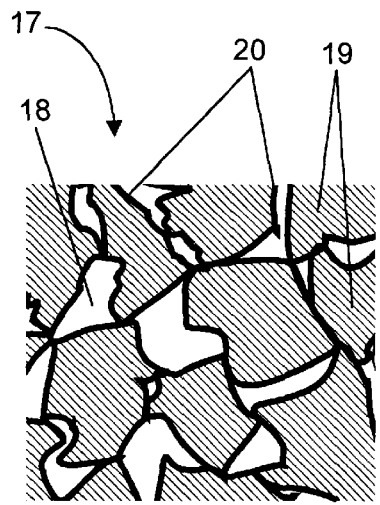
Fig. 2a                                  Fig. 2b
Figure 2. Schematic of the diamond deposition process to form bulk porous diamond.

TECHNIQUE FOR THE FABRICATION OF BULK POROUS DIAMOND

BACKGROUND OF THE INVENTION

1. Field of the Invention

Diamond is a material that has uniquely attractive physical, electrical, thermal, and optical properties. It is also a metastable crystal at room temperature that forms naturally only at extremely high pressures and temperatures. Small industrial diamonds have been grown artificially for a number of years using catalysis, while more recently chemical vapor deposition (CVD) processes have been used to grow relatively large diamond thin films that have a wide variety of mechanical and optical uses. All of these synthesis processes produce commercial diamond that is small in at least one dimension. The generic problem with current processes used for artificial diamond growth is that the growth rate is too slow to be practical for bulk diamond growth. There have always been applications for which bulk diamond would be a far superior choice to presently available materials as a result of the high strength, high thermal conductivity, high resistance to thermal shock, and infrared transmissivity of diamond. An additional requirement for a bulk diamond fabrication process is that it should be a net shape growth process, because machining and polishing an arbitrary piece to a final shape would be extremely difficult.

2. Description of the Related Art

It is the primary object of the present invention to provide a process by which separate diamond particles can be joined together to form a single piece of polycrystalline diamond.

Heretofore, synthetic diamond has been created using a variety of processes for growing crystals. All of these processes create crystals by steadily accreting new atomic matter on the surface of some small seed crystal or substrate. For diamond, the form of atomic carbon appropriate for surface accretion is only naturally available from condensed carbon at extremely high temperature and pressure. Catalytic processes reduce the necessary conditions dramatically but growth conditions are still difficult to achieve and growth rates are very low. CVD processes use plasma or combustion conditions to provide suitable carbon, but the low density of atoms associated with a gas or plasma again leads to low growth rates in one dimension, although wide areas of thin films can be grown.

Fullerenes are one form of pure carbon where the molecules that are made up of carbon atoms form a hollow shell. $C_{60}$ is one such molecule that is unusually stable and has a spherical structure. Fullerenes complement the planar form of carbon (graphite) and the tetrahedral carbon crystal known as diamond. Fullerenes are different from graphite and diamond in that they can have a high vapor pressure at moderate temperatures and in that they have a high solubility in common solvents. Fullerenes are potential precursors in many plasma chemistry and chemical vapor deposition processes.

Gruen et. al. [1,2] have grown diamond thin films using $C_{60}$ fullerene as the precursor in the standard plasma-enhanced chemical vapor deposition (PECVD) process. The extensive fragmentation of $C_{60}$ to $C_2$ in an argon plasma observed by Gruen et. al. led them to develop the use of $C_{60}$ as a precursor for CVD growth of diamond films. Fullerene containing soot was placed in a sublimator oven, heated to 550 degrees C. (°C.), and an Argon/Hydrogen ($Ar/H_2$) mixture (20 standard cubic centimeters per minute—sccm Ar, 4 sccm $H_2$) was passed through the sublimator into the plasma chamber while maintaining a total pressure of 100 torr. A 76 millimeters (mm) diameter single-crystal silicon disk, which had been mechanically treated with 0.1 mm diamond powder, was placed on a graphite holder and maintained at 850° C. during the experiment. A 1500 Watt (W) microwave discharge was maintained in the gas mixture during a 16 hour (h) deposition. Optical emission measurements showed intense $C_2$ Swan band emission, as well as intense hydrogen alpha ($H_\alpha$) and $H_\beta$ but relatively much weaker Ar emission lines. The silicon substrate was examined after the deposition using scanning electron microscopy (SEM), x-ray diffraction (XRD), and Raman spectroscopic techniques to verify diamond deposition [2]. Under these conditions, no film growth was observed in a fullerene-free argon plasma. Deposition was carried out at 850° C. with 1500W of microwave power for 1–3h. Based on cross-section scanning electron microscope (SEM) images, it was estimated that the diamond growth rate was about 1.2 mm/h, which is at least comparable to that observed using 1% methane in hydrogen as a precursor under similar deposition conditions.

In situ optical measurements reveal very intense $C_2$ Swan band emission, which is believed to be a result of collisional and other fragmentation processes of the $C_{60}$. [3] The $C_2$ fragments are thought to be the primary precursor species for fullerene diamond growth. The Swan band emission is an experimental indication that $C_{60}$ fragmentation occurs as a result of successive elimination of neutral $C_2$ groups. [4].

Fullerene Photofragmentation Many studies have shown that $C_{60}$ photofragmentation results in even-numbered clusters in the range $C_{60}$–$C_{32}$ [e.g. 5]. With this approach, rate constants for fragmentation and for delayed electron emission have been deduced. Wurz and Lykke [6,7] have investigated the processes of fullerene photofragmentation and photoionization. The interaction of intense laser light in the visible and UV wavelength range with gas-phase $C_{60}$ leads to high internal excitation (~50 electron-Volts (eV)) of the $C_{60}$ molecule rather than direct multiphoton ionization. $C_{60}$ has a very rigid and highly symmetric molecular structure that has a very high density of vibrational states and thus an extremely rapid thermalization ($10^{-14}$ seconds (s)) of a photoexcited electronic state. For this reason the neutral $C_{60}$ molecule has been shown experimentally and theoretically to absorb 10–20 photons to form a superexcited molecule, even though 2–3 photons are sufficient to achieve multiphoton ionization (7.6 eV ionization energy). Delayed ionization (time scale 1–10 milliseconds) and fragmentation both have these high internal excitations as common precursors and both were found to occur at about the same rates.

The experimental work of Wurz and Lykke investigated a wide fluence and wavelength range to map out the different parameters that characterize these processes. A Tantalum cup filled with approximately 200 milligrams of pure $C_{60}$ was held at a temperature of 800 Kelvins to give a vapor pressure of about $5 \times 10^{-4}$ Torr. Laser fluences from 0.01 to $10^3$ millijoules per square centimeter were used at wavelengths of 212, 266, 355, and 532 nanometers (nm). As long as the photon energy was less than that needed for direct ionization, high fluence laser irradiation of $C_{60}$ resulted in thermal fragmentation and delayed ionization with equal efficiencies. Thus, for submicrosecond laser pulses photofragmentation is the dominant result of laser energy absorption by $C_{60}$. Furthermore, $C_{60}$, is a non-linear optical material whose absorption increases by a factor of 3–5 for its excited states.

It is therefore an object of the present invention to provide a process for fabricating porous polycrystalline diamond material whose volume is described by a dimension larger than 1 mm, with no upper limit on size.

It is another object of the present invention to provide a process by which single pieces of diamond of arbitrary shape can be fabricated.

Heretofore diamond could only be produced in small size from natural diamond crystals discovered, or in thin films by CVD processes. By making a mold, filling it with diamond particles, and joining these particles by the $C_{60}$ photofragmentation diamond growth processes, diamond of arbitrary shape can be produced, limited only by the necessary access for the optical excitation that fragments the $C_{60}$ vapor permeating the part.

It is another object of the present invention to provide a process by which large pieces of diamond can be fabricated with controlled porosity.

By controlling the size and shape of the diamond particles used to form the bulk diamond the porosity of the final piece can be controlled. Larger particles will lead to larger pores, as will reduced compaction of a mass of smaller particles. Columnar passages can be created by first fabricating rods and then joining the rods together. A wide variety of internal geometries can be created using this and related concepts.

It is another object of the present invention to provide a process by which large pieces of diamond can be made with non-porous surfaces, having only internal porosity. Such pieces would be created by first making bulk porous pieces and then using conventional CVD diamond growth to add a solid, continuous diamond coating on the outside of these pieces.

SUMMARY OF THE INVENTION

A method and system is described for fabricating porous polycrystalline diamond material whose volume is described by a dimension larger than 1 mm, with no upper limit on size. A net shape diamond part is fabricated by compacting small diamond particles into a mold and then performing chemical vapor deposition (CVD) growth of diamond on the particles until they are joined into a porous whole. The CVD growth of diamond is achieved by laser-driven photofragmentation of vapor phase Fullerene, $C_{60}$, molecules in the pores.

BRIEF DESCRIPTION OF THE DRAWINGS

FIG. 1 illustrates a system constructed in accordance with the invention for manufacturing bulk porous diamond.

FIG. 2(a) shows a schematic of a cross-section of a small volume of compacted diamond particles and the spaces between them.

FIG. 2(b) shows a schematic of a cross-section of the same small volume of compacted diamond particles shown in FIG. 1(a) after the invented process has occurred and a CVD diamond film has coated the particles and joined them together.

DESCRIPTION OF PREFERRED EMBODIMENTS

A bulk diamond fabrication system 1 (herein after system 1) constructed in accordance with the invention is illustrated in FIG. 1. This particular apparatus might be used to make a thick diamond plate. A layer of solid $C_{60}$ powder 2 is covered by a layer of quartz beads 3, which is in turn covered by a layer of small diamond chips 4, all contained in a quartz container 5. There are a number of possible sources of diamond chips. The requirements are a minimum of 10 micrometers ($\mu$m) diameter, and a transparency similar to Type 1 diamond (transparent for wavelengths longer than 320 nm). To achieve uniform temperature, the quartz container 5 would be insulated 6 and mounted on a metal shelf 7 and heated using standard coils 8. The vapor might be enclosed within the container 5 by using a sapphire window 10 heated by another coil 9. Sapphire is used as a result of its high thermal conductivity. This window 10 can be omitted if the vapor is allowed to fill the entire vacuum chamber 14. The entire apparatus that rests on the shelf 7 would be thermally insulated from the vacuum chamber 14 by a ceramic table 11 and kept isothermal at temperatures appropriate to maintain a high $C_{60}$ vapor pressure—on the order of 800° C. Thermal equilibrium will be maintained by radiant heating, which is quite significant at this temperature and will maintain heat transfer in the vacuum. The vacuum vessel 14 will be thermally insulated on its outside with ports for vacuum/low pressure regulation 15, and laser access 13. The optical excitation source for the $C_{60}$ photofragmentation is shown as a laser 12 from an external laser system that enters the vacuum container 14 through a window 13.

The chamber 14 will be evacuated and then the container 5 will be heated to fill it with $C_{60}$ vapor. $C_{60}$ condensation on cold surfaces of the chamber 14 is be prevented either by back filling with argon to 1 Torr or by heating the chamber walls. Care must be taken to keep oxygen out of the apparatus because $C_{60}$ reacts rapidly with oxygen at high temperatures. No $C_{60}$ solid films can be allowed to build up on laser illuminated window surfaces to prevent the laser light from polymerizing the film into an inert graphitic structure [8].

Photofragmented Fullerene, $C_{60}$, (a spherical molecule of 60 carbon atoms) diamond deposition and crystal growth is to be used to transform a compacted porous volume of separate diamond chips into a single large piece of porous diamond. The basis for this approach is separate work that shows that 1) Diamond is currently being grown from fullerene fragments in an argon microwave plasma; this process has been extensively investigated, and 2) $C_{60}$ photofragmentation occurs in response to excitation by a high intensity light source; this fragmentation occurs in preference to ionization or other de-excitation processes as a result of the unusual nature of the resonant bonding in the fullerene molecule. Photofragmentation is a prerequisite for diamond deposition in the pores of a volume filled with diamond chips. Any type of standard plasma or gas flow based process is not possible on the small scale of the voids in a bulk material because the walls quench the active species that lead to diamond formation.

The bulk diamond fabrication process described herein performs diamond deposition and bonding of loose diamond particles to form a specified, porous volume in a mold. The resulting volume material is expected to be porous bulk polycrystalline diamond that has physical, thermal, and electrical characteristics closely approximating those of diamond. The deposition and bonding is achieved in a CVD process through photofragmentation of fullerene vapor using pulsed laser illumination. Using an intense laser source $C_{60}$ fullerenes are fragmented to cause diamond growth before the excited molecules are collisionally quenched by the solid. The transparency of the diamond chips, the mold, and the voids saturated with fullerene vapor allows the laser radiation to penetrate the volume and drive the diamond growth process.

Based on the $C_{60}$ CVD diamond film growth experiments [1,2] the preferred temperature of the substrate and vapor source for experiments is in the range 800–850° C. This temperature range is also the established optimum for CVD diamond growth. It maximizes the vapor pressure of $C_{60}$ while remaining below the decomposition temperature. A uniform temperature throughout the CVD chamber prevents the $C_{60}$ vapor from condensing.

The pulsed laser source is specified by the requirements for $C_{60}$ fragmentation and deposition in the pores of a solid. To change individual diamond particles into bulk diamond the contact between the particles must be such that the micron/hr growth rates typical of CVD diamond growth can fill the gaps between particles in a reasonable time. This constrains pore size for uniformly sized particles. Assuming a 800° C. temperature, the velocity of a $C_{60}$ molecule is on the order of $10^4$ cm/s. Assuming a 10 $\mu$m diameter pore the average time before wall collision is then on the order of 10 nanoseconds (ns), a time which is a standard pulse length for a high power Q-switched laser. The minimum required laser energy is estimated by requiring that the fragmentation energy of 50 eV must be pumped into a $C_{60}$ molecule with an 11 Å diameter. Thus $10^{-17}$ joules in a cross sectional area of $10^{-18}$ m$^2$ is required; on the order of 10 J/m$^2$. An Alexandrite laser (Light Age, Inc. Model 101-PAL) with a second harmonic generated (SHG) 0.1J pulse energy, 20 ns pulse length, and 20 hertz (Hz) repetition rate in the wavelength range of 360–400 nm can be used. A spot size of 1 cm$^2$ gives the needed 10 J/m$^2$, and can be scanned over a surface.

The total time/number of pulses needed to create bulk diamond depends on the internal $C_{60}$ vapor pressure, the $C_{60}$ vapor flow rate into the pores, and the fragmentation rate that controls the internal diamond deposition and growth rate. Scattering of light by the diamond particles will limit the total depth penetration of the laser beam. The penetration depth will be affected by the size and shape of the diamond particles. Thicker parts can be built up by adding sequential layers, limited in thickness by the laser penetration. Too rapid a diamond deposition at any surface will block further $C_{60}$ flow through the bulk as well as depleting the $C_{60}$ concentration for downstream deposition.

FIG. 2A and FIG. 2B. show a schematic of the diamond deposition process that forms bulk porous diamond. FIG. 2A shows a cross-section schematic 16 on a microscopic scale of diamond particles at the initial state of the process. Fullerene, $C_{60}$, vapor is perfused into the voids 18 between the diamond particles 19. The $C_{60}$ vapor source consists of solid $C_{60}$ heated to elevated temperature in a vacuum or inert atmosphere. The vapor source is external to the particles; the vapor flows or diffuses into the voids in the particle mass through the labyrinthine three-dimensionally connected porosity that naturally occurs in any compacted mass of separate particles. When subjected to intense illumination the $C_{60}$ molecules fragment and diamond growth occurs on all surfaces around the pores between the particles. FIG. 2B shows a cross-section schematic 17 of the same microscopic volume as shown in FIG. 2A, but at a time after sufficient deposition and growth of a new diamond layer 20 has occurred and diamond connections have been made between the particles, making the entire mass a unitary diamond entity. The process is analogous to sintering, except that the particle joining only results from accretion, and not rearrangement of surface atoms as is usually the case in sintering. The light that fragments the $C_{60}$ is not absorbed by the diamond, and can thus penetrate into the voids, although it is refracted by the diamond particles. Only a small fraction of the excited light is absorbed by the vapor, so the light can drive the fragmentation reaction deep inside the particle mass. As the process proceeds the porosity is continually reduced by diamond growth in the pores, which reduces the size of the flow passages that supply the $C_{60}$ vapor. Eventually a limiting pore size, and minimum porosity is reached where negligibly small growth results from restricted vapor flow. This condition marks the end of the processing.

Other References

1. D. M. Gruen, S. Liu, A. R. Krauss, J. Luo, and X. Pan, Appl. Phys. Lett., 64, 12, 1502–1504, (1994).
2. D. M. Gruen, S. Liu, A. R. Krauss, and X. Pan, J. Appl. Phys., 75, 3, 1758–1763, (1994).
3. D. Gruen, Nucl. Instrum. Methods in Phys. Res. B, 78, 118 (1993).
4. S. C. O'Brien, J. R. Heath, R. F. Curl, R. E. Smalley, J. Chem. Phys., 88, 220, (1988).
5. P. Wurz, K. R. Lykke, M. J. Pellin, and D. M. Gruen, J. Appl. Phys., 70, 6647 (1991).
6. P. Wurz. and K. Lykke, J. Chem. Phys., 95, 7008 (1991).
7. P. Wurz and K. R. Lykke, J. Phys. Chem., 96, 10129 (1992).
8. V. Hruby, M. Martinez-Sanchez, S. Bates, D. Lorents, AIAA Paper 94-3240, (1994).

The embodiments of the invention described herein are the best known current uses of the invention and are described by way of illustration. The scope of the invention is set forth in the appended claims, as it is desired to protect all uses of the invention apparent to those skilled in the art in addition to those described herein.

What is claimed is:

1. A process for manufacturing bulk diamond comprising the following steps:

a) forming a fullerene $C_{60}$ vapor;

b) evacuating a chamber that contains compacted 1 to 10 micrometer size diamond particles with clean surfaces and then sealing the chamber;

b) passing said fullerene $C_{60}$ vapor into said chamber, permeating the voids between the diamond particles with said fullerene $C_{60}$ vapor, and maintaining the said fullerene $C_{60}$ vapor in said voids;

c) subjecting said fullerene $C_{60}$ vapor contained in said voids between the diamond particles to laser irradiation of approximately 10 joules per square meter in a 10 nanosecond pulse that causes fragmentation of said fullerene $C_{60}$ vapor to form carbon $C_2$ species; and d) depositing said fragmented fullerenes, containing carbon $C_2$ species generated by said laser irradiation, to form a diamond film on the surfaces of the diamond particle that surround the voids between the diamond particles; and e) continuing said deposition until said diamond film on each diamond particle joins with the film on other diamond particles to form a single porous piece of polycrystalline diamond.

2. A process according to claim 1, wherein the fullerene $C_{60}$ vapor is in gaseous, liquid, or solid state.

3. A process according to claim 1, wherein the fullerene $C_{60}$ vapor is supplied in a mixture with any other material.

4. A process according to claim 1, wherein the fullerene $C_{60}$ vapor is created from any different source of carbon material.

5. A process according to claim 1, wherein the diamond particles are single crystal or polycrystalline, possessing any impurities, are of any size, or are of any shape.

6. A process according to claim 1, wherein said chamber is made of any material, is of any size, or is of any shape that is capable of being used to enable the $C_{60}$ photofragmentation growth of diamond.

7. A process according to claim 1, wherein any source of photons that has adequate photon flux and photon energy for the photofragmentation of $C_{60}$ molecules is used.

* * * * *